United States Patent
Yoon et al.

(10) Patent No.: US 9,905,631 B2
(45) Date of Patent: Feb. 27, 2018

(54) DISPLAY DEVICE

(71) Applicant: SAMSUNG DISPLAY CO., LTD., Yongin-si, Gyeonggi-do (KR)

(72) Inventors: Soowan Yoon, Yongin-si (KR); Jaehyung Cho, Yongin-si (KR); Myungho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/252,083

(22) Filed: Aug. 30, 2016

(65) Prior Publication Data

US 2017/0069706 A1 Mar. 9, 2017

(30) Foreign Application Priority Data

Sep. 3, 2015 (KR) ........................ 10-2015-0124935

(51) Int. Cl.
| | |
|---|---|
| *H01L 33/62* | (2010.01) |
| *H01L 27/32* | (2006.01) |
| *H01L 51/52* | (2006.01) |
| *G09G 3/20* | (2006.01) |
| *G09G 3/3225* | (2016.01) |

(52) U.S. Cl.
CPC ........... *H01L 27/3279* (2013.01); *G09G 3/20* (2013.01); *H01L 33/62* (2013.01); *H01L 51/5256* (2013.01); *G09G 3/3225* (2013.01); *G09G 2300/023* (2013.01); *G09G 2300/0426* (2013.01); *G09G 2300/0452* (2013.01); *G09G 2380/02* (2013.01)

(58) Field of Classification Search
CPC ... G09G 3/20; H01L 27/3279; H01L 51/5256; H01L 33/62
See application file for complete search history.

(56) References Cited

U.S. PATENT DOCUMENTS

| | | | |
|---|---|---|---|
| 6,930,744 B1 | 8/2005 | Ukita | |
| 2006/0192496 A1* | 8/2006 | Yamada | ................. G09G 3/325 315/169.3 |
| 2007/0046322 A1* | 3/2007 | Jeoung | ................ G02F 1/13458 324/760.02 |

(Continued)

FOREIGN PATENT DOCUMENTS

| | | |
|---|---|---|
| JP | 2000-321591 A | 11/2000 |
| KR | 10-2005-0068855 A | 7/2005 |

(Continued)

*Primary Examiner* — Allan R Wilson
(74) *Attorney, Agent, or Firm* — Lewis Roca Rothgerber Christie LLP

(57) ABSTRACT

A display device includes a display panel including a display area for displaying an image, and a non-display area outside of the display area and including a pad area, a pad in the pad area, and including a plurality of pad lines extending from wire lines drawn from the display area toward the non-display area, a driver including a plurality of terminal lines respectively electrically connected to the pad lines, the driver being configured to transmit a signal to, and to receive a signal from, an external board, and a conductive layer between the pad and the driver for electrically connecting the pad and the driver, wherein each of the pad lines crosses and contacts at least two points of a corresponding one of the terminal lines.

16 Claims, 6 Drawing Sheets

(56) References Cited

U.S. PATENT DOCUMENTS

| | | | | |
|---|---|---|---|---|
| 2013/0069069 A1* | 3/2013 | Koo | ............... | G02F 1/136227 257/59 |
| 2013/0170151 A1* | 7/2013 | Lee | ............... | G09G 3/006 361/748 |
| 2014/0125645 A1* | 5/2014 | Ghaderi | ............... | G09G 3/006 345/211 |
| 2014/0226297 A1 | 8/2014 | Kojima | | |
| 2015/0380685 A1* | 12/2015 | Lee | ............... | H01L 51/5243 257/40 |
| 2016/0026313 A1* | 1/2016 | Morein | ............... | G06F 3/0412 345/174 |

FOREIGN PATENT DOCUMENTS

| | | |
|---|---|---|
| KR | 10-2014-0031872 A | 3/2014 |
| KR | 10-2015-0027654 A | 3/2015 |

\* cited by examiner

DISPLAY DEVICE

CROSS-REFERENCE TO RELATED APPLICATION

This application claims priority to, and the benefit of, Korean Patent Application No. 10-2015-0124935, filed on Sep. 3, 2015, in the Korean Intellectual Property Office, the disclosure of which is incorporated herein in its entirety by reference.

BACKGROUND

1. Field

One or more exemplary embodiments relate to a display device.

2. Description of the Related Art

Generally, a display device may be used in a mobile device, such as a smart phone, a laptop computer, a digital camera, a camcorder, a portable information terminal, or a tablet personal computer, or may be used in an electronic device, such as a desktop computer, a television, an outdoor billboard, or an exhibition display device.

Recently, slim display devices have been introduced. From among such slim display devices, a flexible display device that is portable and applicable to variously shaped devices is receiving attention as a next-generation display device.

A display device receives an externally supplied electrical signal to generate an image. A driver connected to an external board is electrically connected to a pad included in the display device.

SUMMARY

One or more exemplary embodiments include a display device, in which a connection between a pad and a driver is smooth to thereby prevent a distortion of a screen.

Additional aspects will be set forth in part in the description that follows and, in part, will be apparent from the description, or may be learned by practice of the presented embodiments.

According to one or more exemplary embodiments, a display panel includes a display panel including a display area for displaying an image, and a non-display area outside of the display area and including a pad area, a pad in the pad area, and including a plurality of pad lines extending from wire lines drawn from the display area toward the non-display area, a driver including a plurality of terminal lines respectively electrically connected to the pad lines, the driver being configured to transmit a signal to, and to receive a signal from, an external board, and a conductive layer between the pad and the driver for electrically connecting the pad and the driver, wherein each of the pad lines crosses and contacts at least two points of a corresponding one of the terminal lines.

The pad lines may be bent in a first direction, and the terminal lines may be bent in a second direction that is opposite to the first direction.

The at least two points may include points where corresponding ones of the pad lines and the terminal lines overlap each other.

Each of the pad lines may cross a corresponding one of the terminal lines at the at least two points in a length direction, and the at least two points may include electrical contact points.

Each of the pad lines may have a substantially same length as the corresponding one of the terminal lines.

The pad lines may be spaced from each other in the first direction of the display panel, the terminal lines may be spaced from each other in the first direction of the display panel, and contact areas between respective ones of the pad lines and the terminal lines may be the same.

The plurality of pad lines may be symmetrical to the plurality of terminal lines when viewed from a plan view.

The conductive layer may be at a location where the plurality of pad lines overlaps the plurality of terminal lines.

The conductive layer may include an anisotropic conductive film.

The first direction may include a forward direction, and the second direction may include a reverse direction.

Each of the pad lines may include a first line, and a second line extending from the first line and bent in the first direction, and each of the terminal lines may include a third line, and a fourth line extending from the third line and bent in the second direction.

The first line may cross the third line at a first contact point of the at least two contact points, and the second line may cross the fourth line at a second contact point of the at least two contact points.

The display panel may further include a plurality of connection areas in one direction of the display panel, and groups of the pads may be connected to a driver in each of the connection areas.

The display panel may further include a display substrate, a plurality of devices on the display substrate, a plurality of insulating layers that insulate the plurality of devices, and an encapsulation layer that covers the display substrate.

The pad area may include an exposed area of the display substrate, and the pad may be arranged in one direction of the display substrate.

The driver may include a chip-on-film (COF) in which a driver integrated circuit (IC) is mounted on a film.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION

Figure 1:
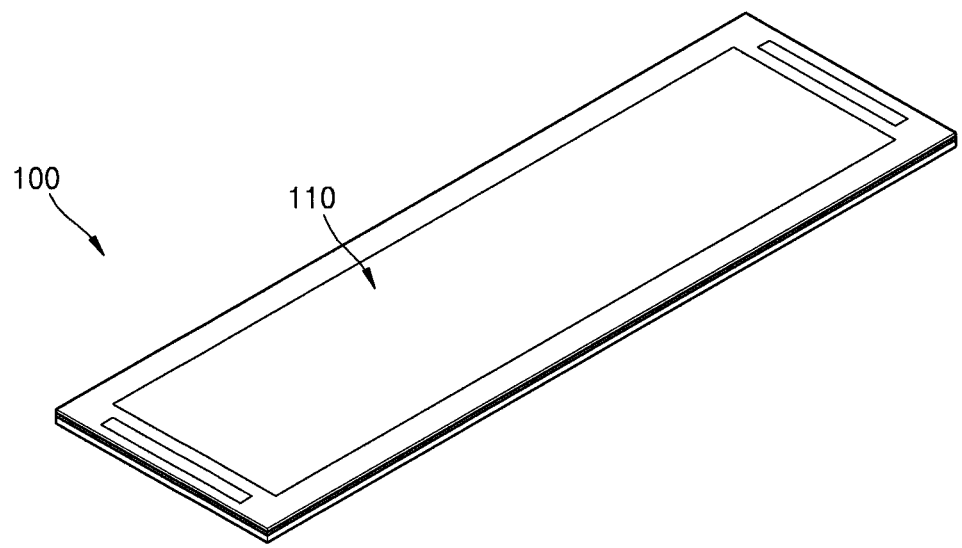
FIG. 1 is a perspective view illustrating a display device unrolled according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section.

Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
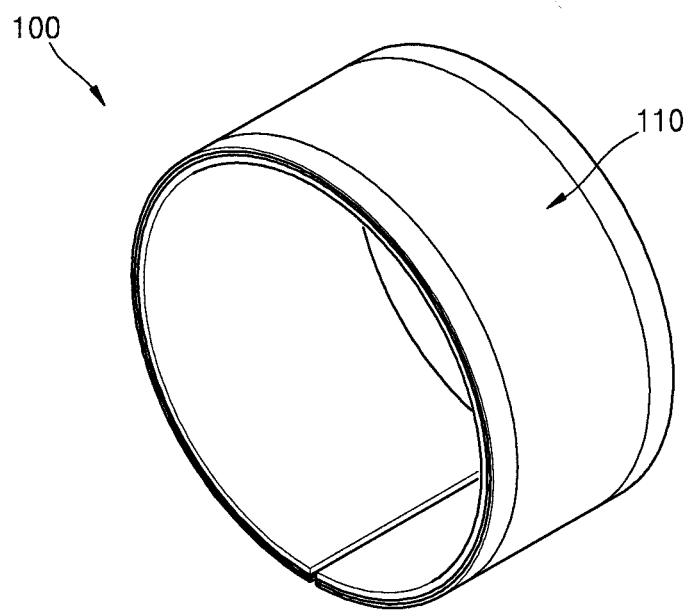
FIG. 2 is a perspective view illustrating the display device of FIG. 1 when rolled.

FIG. 1 is a perspective view illustrating a display device 100 unrolled according to an exemplary embodiment, and FIG. 2 is a perspective view illustrating the display device 100 of FIG. 1 when rolled.

According to an exemplary embodiment, the display device 100 may be a flexible display device using a flexible film as a substrate. However, the inventive concept is not limited thereto, and the display device 100 may be a rigid display device using a glass as a substrate.

According to an exemplary embodiment, the flexible display device 100 may be an organic light-emitting display device (OLED). However, the inventive concept is not limited thereto, and the display device 100 may be a liquid crystal display (LCD) device, a field emission display (FED) device, or an electronic paper display (ED) device.

Referring to FIGS. 1 and 2, the display device 100 includes a flexible display panel 110 for displaying an image. The flexible display panel 110 includes various films, such as a touch screen and a polarization plate, as well as a display substrate.

A user may view an image under various states in which the display device 100 is unrolled, curved, or cylindrically rolled.

Figure 3:
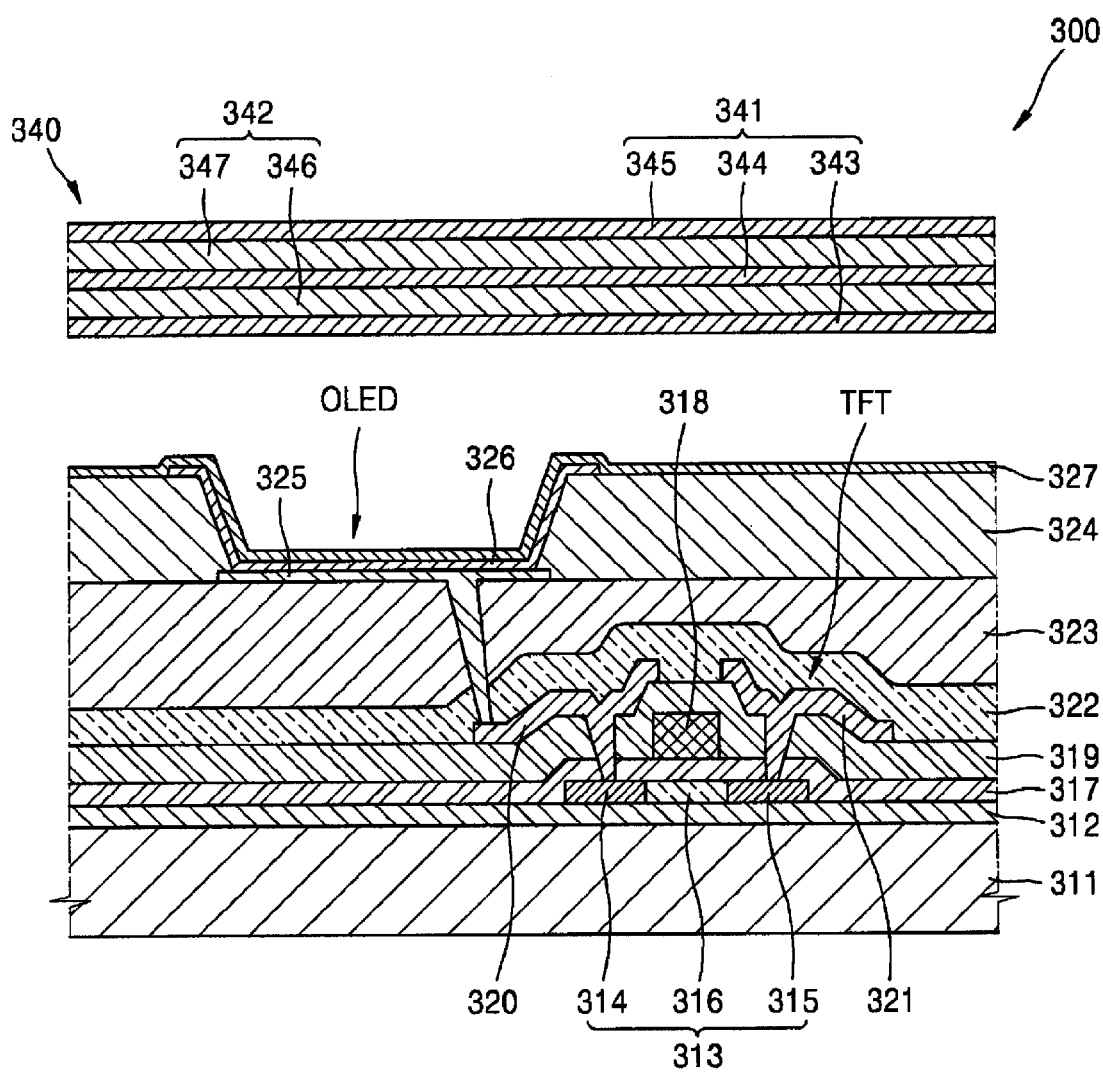
FIG. 3 is a cross-sectional view illustrating one sub-pixel of an organic light-emitting display device according to an exemplary embodiment.

FIG. 3 is a cross-sectional view illustrating one sub-pixel of an organic light-emitting display device 300 according to an exemplary embodiment.

According to an exemplary embodiment, one sub-pixel includes at least one thin film transistor (TFT), and an organic light-emitting device (OLED). The TFT is not necessarily implemented by using only a structure of FIG. 3, and the number of TFTs and the structure of the TFT may be modified variously.

Referring to the FIG. 3, the organic light-emitting display device 300 includes a display substrate 311, and an encapsulation layer 340 formed on the display substrate 311.

The display substrate 311 may be a flexible glass substrate, a flexible polymer substrate, or a rigid glass substrate. The display substrate 311 may be transparent, semi-transparent, or opaque.

A barrier layer 312 may be formed on the display substrate 311. The barrier layer 312 may cover the top surface of the display substrate 311. The barrier layer 312 may include an inorganic material or an organic material. The barrier layer 312 may include a single layer, or may include multiple layers. The barrier layer 312 prevents penetration of impurities of the display substrate 311 into the TFT or into the OLED, and planarizes the top surface of the display substrate 311.

The TFT may be formed on the barrier layer 312. Though the TFT is described as a top gate transistor in the present embodiment, a TFT of another structure, such as a bottom gate transistor, may be provided in other embodiments of the present invention.

A semiconductor active layer 313 may be disposed on the barrier layer 312. The semiconductor active layer 313 includes a source region 314 and a drain region 315, which are doped with N-type impurity ions or P-type impurity ions. A region between the source region 314 and the drain region 315 may be a channel region 316 that is not doped with impurities. The semiconductor active layer 313 may include an organic semiconductor, an inorganic semiconductor, or amorphous silicon. The semiconductor active layer 313 may include an oxide semiconductor.

A gate insulating layer 317 may be deposited on the semiconductor active layer 313. The gate insulating layer 317 may include an inorganic layer. The gate insulating layer 317 may include a single layer or may include multiple layers.

A gate electrode 318 may be disposed on the gate insulating layer 317. The gate electrode 318 may include a metallic material having excellent conductivity. The gate electrode 318 may include a single layer, or may include multiple layers.

An interlayer insulating layer 319 may be disposed on the gate electrode 318. The interlayer insulating layer 319 may include an inorganic layer, or may include an organic layer.

A source electrode 320 and a drain electrode 321 may be on the interlayer insulating layer 319. Specifically, a contact hole is formed in the gate insulating layer 317 and in the interlayer insulating layer 319 by removing a portion of the gate insulating layer 317 and the interlayer insulating layer 319. The source electrode 320 may be electrically connected to the source region 314, and the drain electrode 321 may be electrically connected to the drain region 315 via the contact hole.

A passivation layer 322 may be on the source electrode 320 and on the drain electrode 321. The passivation layer 322 may include an inorganic layer or an organic layer. A planarization layer 323 may be on the passivation layer 322. The planarization layer 323 may include an organic layer. In other embodiments of the present invention, one of the passivation layer 322 or the planarization layer 323 may be omitted.

The TFT may be electrically connected to the OLED.

The OLED may be disposed on the planarization layer 323. The OLED may include a first electrode 325, an intermediate layer 326, and a second electrode 327.

The first electrode 325 serves as an anode, and may include various conductive materials. The first electrode 325 includes a transparent electrode or a reflective electrode. For example, if the first electrode 325 includes a transparent electrode, the first electrode 325 includes a transparent conductive layer. If the first electrode 325 includes a reflective electrode, the first electrode 325 includes a reflective layer, and a transparent conductive layer on the reflective layer.

A pixel-defining layer 324 may be formed on the planarization layer 323. The pixel-defining layer 324 may cover a portion of the first electrode 325. The pixel-defining layer 324 limits an emission region of each sub-pixel by surrounding the edge of the first electrode 325. The first electrode 325 may be patterned in each sub-pixel.

The pixel-defining layer 324 may include an organic layer, or may include an inorganic layer. The pixel-defining layer 324 may include a single layer, or may include multiple layers.

The intermediate layer 326 may be disposed on the first electrode 325. The intermediate layer 326 may be formed in a region of the first electrode 325, which is exposed by etching a portion of the pixel-defining layer 324. The intermediate layer 326 may be formed by a deposition process.

The intermediate layer 326 may include an emissive layer. According to another exemplary embodiment, the intermediate layer 326 includes an organic emissive layer, and may further include at least one selected from a hole injection layer (HIL), a hole transport layer (HTL), an electron transport layer (ETL), and an electron injection layer (EIL).

According to still another exemplary embodiment, the intermediate layer 326 may include the organic emissive layer, and may further include other various functional layers.

The second electrode 327 may be on the intermediate layer 326. The second electrode 327 may serve as a cathode. The second electrode 327 includes a transparent electrode or a reflective electrode. For example, if the second electrode 327 includes a transparent electrode, the second electrode 327 includes a metallic layer, and a transparent conductive layer on the metallic layer. In the case where a reflective electrode is used as the second electrode 327, the second electrode 327 includes a metallic layer.

According to an exemplary embodiment, a plurality of sub-pixels may be formed in the display substrate 311, and each sub-pixel may produce a red color, a green color, a blue color, or a white color. However, exemplary embodiments are not limited thereto.

The encapsulation layer 340 may protect the OLED from external moisture, oxygen, etc. The encapsulation layer 340 may include an inorganic layer(s) 341 and an organic layer(s) 342, which are alternately stacked. For example, the inorganic layers 341 in the present embodiment include a first inorganic layer 343, a second inorganic layer 344, and a third inorganic layer 345. The organic layers 342 of the present embodiment include a first organic layer 346 and a second organic layer 347.

Figure 4:
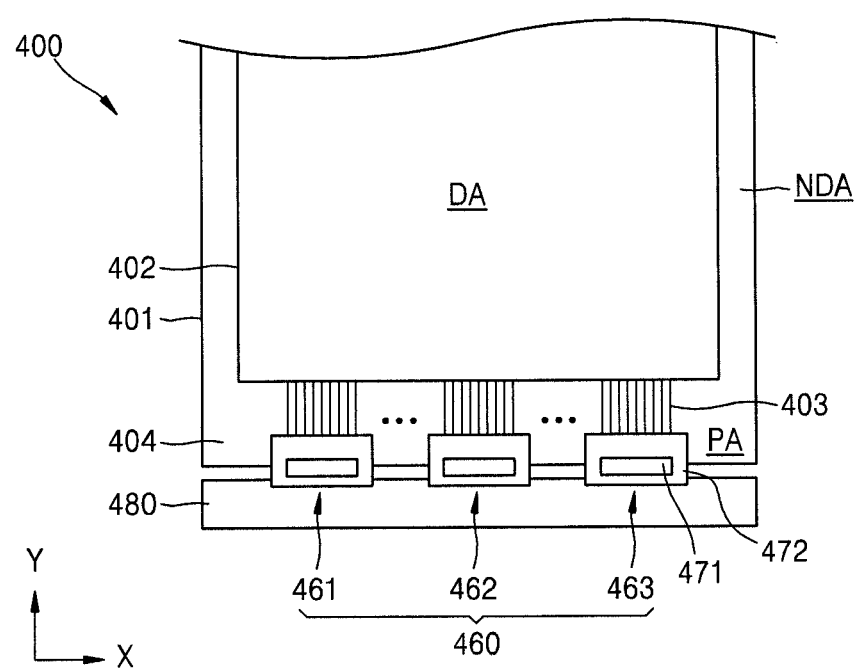
FIG. 4 is a plan view illustrating a driver connected to a pad of a display panel according to an exemplary embodiment.
Figure 5:
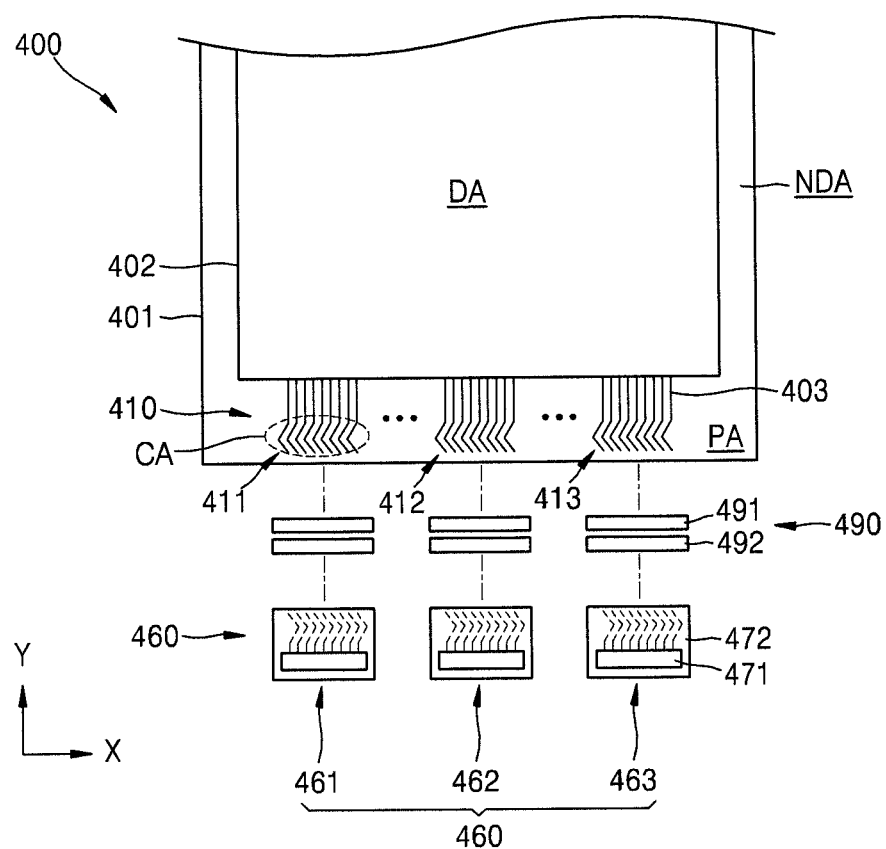
FIG. 5 is a plan view, in which a pad, a driver, and a conductive layer of FIG. 4 are separately illustrated.

FIG. 4 is a plan view illustrating a driver 460 connected to a pad (i.e. a pad 410, shown in FIG. 5) of a display panel 400 according to an exemplary embodiment, and FIG. 5 is a plan view in which the pad 410, the driver 460, and a conductive layer 490 are separately illustrated.

According to an exemplary embodiment, the display panel 400 may be a panel including any one of the display devices 100 and 300 illustrated in FIGS. 1 to 3.

Referring to FIGS. 4 and 5, the display device 400 includes a display substrate 401, and an encapsulation layer 402 covering the display substrate 401.

The display substrate 401 may be a flexible substrate, or may be a rigid substrate. As described above, a plurality of devices, such as TFTs or OLEDs, may be formed on the display substrate 401, and the plurality of devices may be insulated from one another by a plurality of insulating layers.

The encapsulation layer 402 may use any one selected from a flexible film, a glass, and a thin film in which an inorganic layer and an organic layer are stacked. The encapsulation layer 402 may be formed to protect the devices, such as TFTs or OLEDs.

The display panel 400 includes a display area DA for displaying an image, and a non-display area NDA extending outside the display area DA.

The display area DA is an area in which a plurality of gate lines crosses a plurality of data lines, and includes an area in which a device, such as OLED, emits light by using an applied power supply.

The non-display area NDA includes an area 404 in which either the display substrate 401 or the encapsulation layer 402 is exposed outside another element. Wiring lines 403, which are electrically connected to the gate lines or the data lines that are arranged in the display area DA, may be arranged in the non-display area NDA.

The non-display area NDA may include a pad area PA. A plurality of pads 410 may be formed in the pad area PA. The pads 410 may be electrically connected to the wiring lines 403 drawn from the display area DA to the non-display area NDA. The pads 410 may be formed integrally with the wiring lines 403.

The pads 410 may be continuously arranged in one direction of the display panel 400, for example, in the X direction. According to an exemplary embodiment, although the pads 410 are arranged in the X direction of the display panel 400, the pads 410 may be arranged in the Y direction of the display panel 400, or may be arranged in the X direction and the Y direction of the display panel 400.

The driver 460 may be electrically connected to the pads 410. The driver 460 may include a chip on film (COF) structure 472 obtained by mounting a driver IC 471, such as a data driver or a gate driver, on a film 472.

According to an exemplary embodiment, the driver 460 may include a driving circuit, and may have a tape carrier package (TCP) structure, or may have a chip on glass (COG) structure, according to a method of mounting the driving circuit on a substrate.

According to an exemplary embodiment, the display panel 400 may be divided into a plurality of connection areas CA in the X direction, while a plurality of pad groups 410 and a plurality of drivers 460 may be electrically connected in each connection area CA.

Specifically, the pad 410 includes a first pad 411, a second pad 412, and a third pad 413, and the driver 460 includes a first driver 461, a second driver 462, and a third driver 463, which correspond to the first pad 411, the second pad 412, and the third pad 413, respectively. However, the number of pads 410 and the number of drivers 460 are not limited thereto. Each of the first driver 461, the second driver 462, and the third driver 463 may be connected to an external board 480.

The conductive layer 490 may be interposed between the pad 410 and the driver 460 to electrically connect the pad 410 and the driver 460. The conductive layer 490 may be an anisotropic conductive film (ACF) or a bump. A plurality of conductive layers 490 may be disposed between each pad 410 and the driver 460. In the current embodiment, the conductive layer 490 includes a first conductive layer 491 and a second conductive layer 492.

The contact areas between the pads 410 and the drivers 460 may all be the same size. When the contact areas between the pads 410 and the drivers 460 are different sizes, screen distortion may occur due to different contact resistances between the pads 410 and the drivers 460.

Figure 6A:
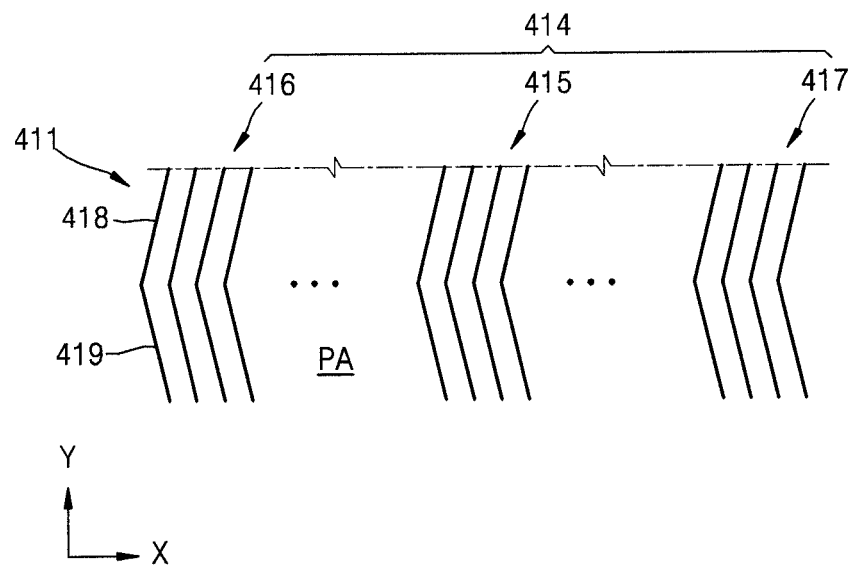
FIG. 6A is a plan view illustrating an arrangement of a plurality of pad lines disposed in a first pad of FIG. 5.
Figure 6B:
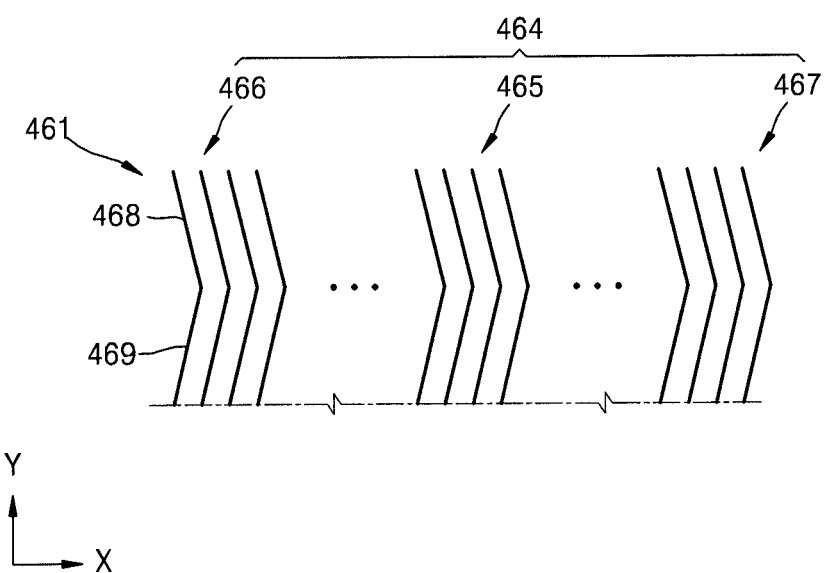
FIG. 6B is a plan view illustrating an arrangement of a plurality of terminal lines disposed in a first driver of FIG. 5.
Figure 6C:
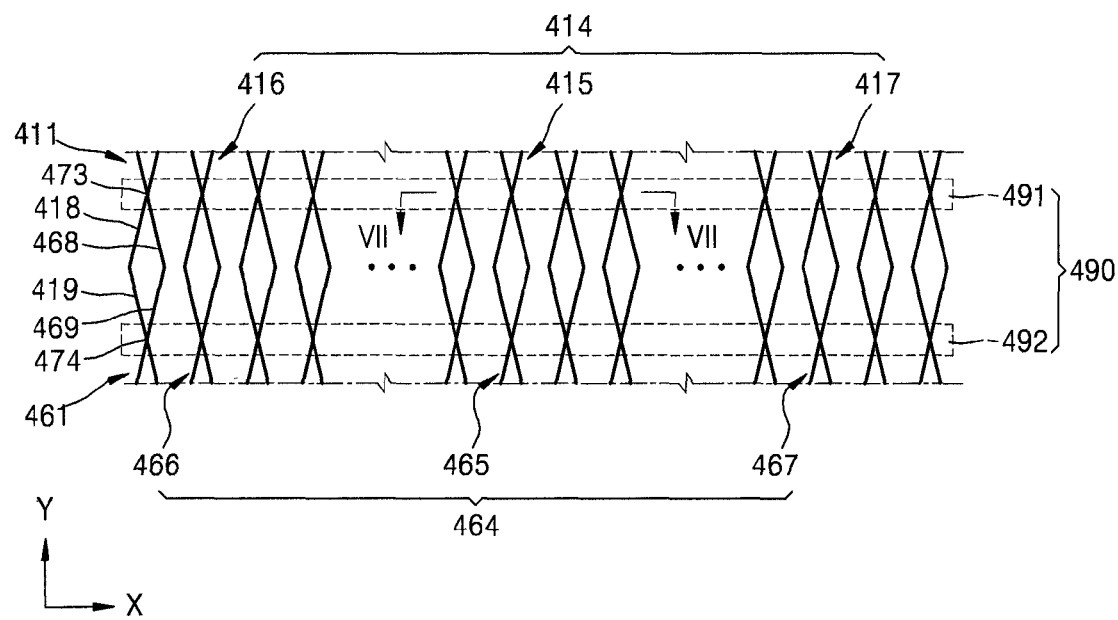
FIG. 6C is a plan view illustrating an arrangement of the first pad, the first driver, and a conductive layer of FIG. 5.

FIG. 6A is a diagram illustrating an arrangement of a plurality of pad lines 414 disposed in the first pad 411 of FIG. 5, FIG. 6B is a diagram illustrating an arrangement of a plurality of terminal lines 464 disposed in the first driver 461 of FIG. 5, and FIG. 6C is a diagram illustrating an arrangement of the first pad 411, the first driver 461, and the conductive layer 490 of FIG. 5.

Hereinafter, the first pad 411 and the first driver 461 are described as an example. Other pads (i.e., the second and third pads 412 and 413), and other drivers, (i.e., the second and third drivers 462 and 463) may have the same structure as the first pad 411 and the first driver 461, respectively.

Referring to FIG. 6A, the first pad 411 includes the plurality of pad lines 414. The plurality of pad lines 414 may extend from the wiring lines 403 of FIG. 5. The plurality of pad lines 414 may be arranged to be spaced apart from each other in the X direction of the display panel 400 of FIG. 5.

The plurality of pad lines 414 includes a plurality of first pad lines 415 arranged in the center of the first pad 411, a plurality of second pad lines 416 arranged at one side (e.g., the left side of FIG. 6A) of the first pad lines 415, and a plurality of third pad lines 417 arranged at the other side (e.g., the right side of FIG. 6A) of the first pad lines 415. The first pad lines 415, the second pad lines 416, and the third pad lines 417 may have the same size and the same shape as each other.

Each of the pad lines 414 includes a first line 418, and a second line 419 bent away from the first line 418 in a first direction (e.g., bent toward the right direction of FIG. 6A).

Specifically, the first line 418 may be a straight line, and may be arranged in one direction of the pad area PA. The first line 418 may be slanted, or diagonally arranged, in the pad area PA. The second line 419 may extend from the first line 418, and may be bent toward the first direction. The second line 419 may be a straight line, and may also be diagonally arranged/slanted. The first line 418 and the second line 419 may be symmetrical to each other in the Y direction (e.g., when viewed from a plan view).

In the current embodiment, the pad lines 414 are bent one time, although the present invention is not limited thereto. For example, the pad lines 414 may be arranged in zigzags in the Y direction.

Referring to FIG. 6B, the first driver 461 includes the plurality of terminal lines 464. The plurality of terminal lines 464 may be arranged to be spaced apart from each other in the X direction of the first driver 461. The X direction of the first driver 461 corresponds to the X direction of the display panel 400 of FIG. 5.

The plurality of terminal lines 464 includes a plurality of first terminal lines 465 arranged in the center of the first driver 461, a plurality of second terminal lines 466 arranged at one side (e.g., the left side of FIG. 6B) of the first terminal lines 465, and a plurality of third terminal lines 467 arranged at the other side (e.g., the right side of FIG. 6B) of the first terminal lines 465. The first terminal lines 465, the second terminal lines 466, and the third terminal lines 467 may have the same size and the same shape as each other.

Each of the terminal lines 464 includes a third line 468, and a fourth line 469 that is bent away from the third line 468 in a second direction.

Specifically, the third line 468 may be a straight line, and may be diagonally arranged, or slanted, in one direction of the first driver 461. The fourth line 469 may extend from the third line 468, and may generally be bent in the second direction (e.g., the left direction of FIG. 6B). The fourth line 469 may be a straight line, and may be diagonally arranged, or slanted. The third line 468 and the fourth line 469 may be symmetrical to each other in the Y direction (e.g., symmetrical with respect to an axis of symmetry extending in the X direction when viewed from a plan view).

In the current embodiment, the terminal lines 464 are bent one time, although the present invention is not limited thereto. For example, the terminal lines 464 may be arranged in zigzags in the Y direction.

Referring to FIG. 6C, the pad lines 414 of the first pad 411, and the terminal lines 464 of the first driver 461, may be arranged corresponding to each other. Substantially, the pad lines 414 may be matched one-to-one with the terminal lines 464. The pad lines 414 and the terminal lines 464 may have substantially the same length.

The conductive layer 490 may be interposed between the pad lines 414 and the terminal lines 464. The pad lines 414 may be electrically connected to the terminal lines 464 via the conductive layer 490.

In each of the pad lines 414, the second line 419 may be bent away from the first line 418 in the first direction (e.g., the right direction of FIG. 6C). On the other hand, in each of the terminal lines 464, the fourth line 469 may be bent away from the third line 468 in the second direction (e.g., the left direction of FIG. 6C). The first direction may be referred to as a forward direction, and the second direction may be referred to as a reverse direction. The pad lines 414 and the terminal lines 464 may be bent at least one time in opposite directions.

Each pad line 414 may cross a terminal line 464 corresponding thereto, and may electrically contact the terminal line 464 at at least two points. The points at which each pad line 414 contacts a corresponding terminal line 464 may be points at which the pad line 414 and the terminal 464 corresponding thereto overlap each other in a stacking direction in which the pad line 414, the corresponding terminal line 464, and the conductive layer 490 (i.e., in a vertical direction of the display panel 400).

The pad line 414 may cross the terminal line 464 corresponding thereto at at least two points in a length direction (e.g., the Y direction), and may have at least two contact points. Specifically, a first contact point 473 may be positioned at a place where the first line 418 of each pad line 414 crosses the third line 468 of each terminal line 464, and a second contact point 474 may be positioned at a place where the second line 419 of each pad line 414 crosses the fourth line 469 of each terminal line 464.

In an exemplary embodiment, each pad line 414 and the terminal line 464 corresponding thereto may be bent in different directions, and the pad line 414 may cross the terminal line 464 corresponding thereto at at least two points, thereby forming at least two contact points. However, the inventive concept is not limited thereto.

In an exemplary embodiment, the pad lines 414 and the terminal lines 464 may be arranged in zigzags, and a plurality of contact points may be formed at portions of the pad lines 414 that overlap the terminal lines 464.

The pad lines 414 may be connected to the terminal lines 464, respectively, in one direction (e.g., the X direction) of the display device 400. The contact areas between the pad lines 414 and the terminal lines 464 may be all the same size.

Specifically, the first pad line 415, the second pad line 416, and the third pad line 417 of the first pad 411, and the first terminal line 465, the second terminal line 466, and the third terminal line 467 of the first driver 461 may each have two contact points 473 and 474. The contact areas between the pad lines 414 and the terminal lines 464 may be all substantially the same size. Accordingly, the pad lines 414 and the terminal lines 464 do not have a difference in contact resistance depending on positions.

All of the pad lines 414 may be bent in the same direction on the display panel 400. All of the terminal lines 464 may be bent in the same direction on the first driver 461. The pad lines 414 may be bent in an opposite direction to the terminal lines 464. The pad lines 414 may be symmetrical to the terminal lines 464 in the X direction (e.g., symmetrical with respect to an axis of symmetry extending in the Y direction when viewed from a plan view).

The conductive layer 490 may be interposed in a place where the pad lines 414 overlap the terminal lines 464.

Specifically, a first conductive layer 491 may be positioned at the first contact point 473, and a second conductive layer 492 may be positioned at the second contact point 474. The number of the conductive layers 490 is not limited to two, and may be changed.

The first conductive layer 491 and the second conductive layer 492 may have the same shape. The first conductive layer 491 may have a size that may cover a plurality of first contact points 473, and the second conductive layer 492 may have a size that may cover a plurality of second contact points 474.

Figure 7:
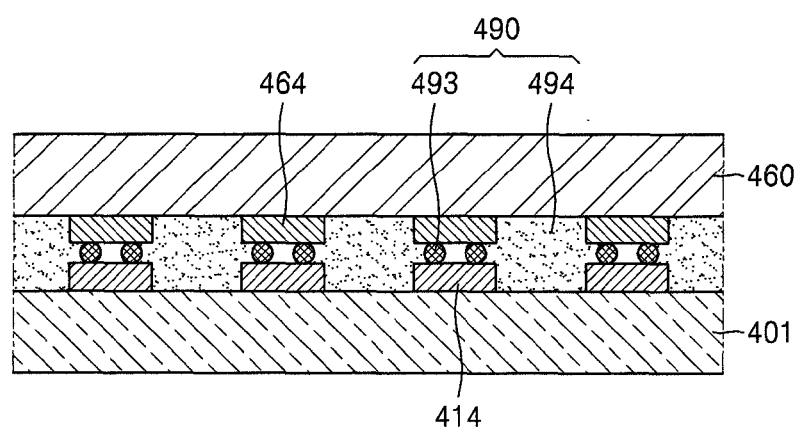
FIG. 7 is a cross-sectional view illustrating an arrangement of the first pad, the first driver, and the conductive layer of FIG. 6C.

As shown in FIG. 7, the conductive layer 490 may be between the pad lines 414 formed on the display substrate 401, and the terminal lines 464 formed on the driver.

The conductive layer 490 may be a conductive film in which current flows in a thickness direction of the conductive film, and may be insulated in a length or width direction of the conductive film. The conductive film 490 may be an anisotropic conductive film (ACF).

The conductive film 490 may include conductive particles 493, such as conductive balls, for forming an electrical pathway, and may include an insulating resin 494 for improving the connection reliability of the conductive particles 493.

The pad lines 414 may be connected to the terminal lines 464 by using a pressure device, such as a hot bar. Specifically, when heat and pressure are applied to the driver 460, the conductive particles 493 may be electrically connected between the pad lines 414 and the terminal lines 464. The insulating resin 494 may be dispersed outside an area at which the pad lines 414 are combined with the terminal lines 464, and may insulate the contact points 473 and 474 from each other.

In this manner, at least two contact points 473 and 474 may be positioned at places where each pad line 414 crosses a terminal line 464 corresponding thereto, and the sizes of contact areas may be the same. Accordingly, a distortion of a screen, which occurs due to a difference in contact resistance, may be reduced or prevented.

As described above, in the display device according to the inventive concept, the sizes of contact areas between a plurality of pads and a plurality of drivers are the same, and thus a difference in contact resistance may be reduced. Accordingly, a distortion of a screen that occurs due to a difference in contact resistance may be reduced or prevented.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
   a display panel comprising a display area for displaying an image, and a non-display area outside of the display area and comprising a pad area;
   a pad in the pad area, and comprising a plurality of pad lines extending from wire lines drawn from the display area toward the non-display area;
   a driver comprising a plurality of terminal lines respectively electrically connected to the pad lines, the driver being configured to transmit a signal to, and to receive a signal from, an external board; and
   a conductive layer between the pad and the driver for electrically connecting the pad and the driver,
   wherein each of the pad lines crosses and contacts at least two different contact points of a single corresponding one of the terminal lines.

2. The display device of claim 1, wherein the pad lines are bent in a first direction, and
   wherein the terminal lines are bent in a second direction that is opposite to the first direction.

3. The display device of claim 2, wherein the at least two contact points comprise points where corresponding ones of the pad lines and the terminal lines overlap each other.

4. The display device of claim 2, wherein each of the pad lines crosses a corresponding one of the terminal lines at the at least two contact points in a length direction, and
   wherein the at least two contact points comprise electrical contact points.

5. The display device of claim 4, wherein each of the pad lines has a substantially same length as the corresponding one of the terminal lines.

6. The display device of claim 2, wherein the pad lines are spaced from each other in the first direction of the display panel,
   wherein the terminal lines are spaced from each other in the first direction of the display panel, and
   wherein contact areas between respective ones of the pad lines and the terminal lines are the same.

7. The display device of claim 2, wherein the plurality of pad lines is symmetrical to the plurality of terminal lines when viewed from a plan view.

8. The display device of claim 2, wherein the conductive layer is at a location where the plurality of pad lines overlaps the plurality of terminal lines.

9. The display device of claim 8, wherein the conductive layer comprises an anisotropic conductive film.

10. The display device of claim 2, wherein the first direction comprises a forward direction, and
    wherein the second direction comprises a reverse direction.

11. The display device of claim 2, wherein each of the pad lines comprises a first line, and a second line extending from the first line and bent in the first direction, and
    wherein each of the terminal lines comprises a third line, and a fourth line extending from the third line and bent in the second direction.

12. The display device of claim 11, wherein the first line crosses the third line at a first contact point of the at least two contact points, and
    wherein the second line crosses the fourth line at a second contact point of the at least two contact points.

13. The display device of claim 1, wherein the display panel further comprises a plurality of connection areas in one direction of the display panel, and
    wherein groups of the pad lines are connected to a driver in each of the connection areas.

14. The display device of claim 1, wherein the display panel further comprises:
    a display substrate;
    a plurality of devices on the display substrate;
    a plurality of insulating layers that insulate the plurality of devices; and
    an encapsulation layer that covers the display substrate.

15. The display device of claim 14, wherein the pad area comprises an exposed area of the display substrate, and
    wherein the pad is arranged in one direction of the display substrate.

16. The display device of claim 1, wherein the driver comprises a chip-on-film (COF) in which a driver integrated circuit (IC) is mounted on a film.

* * * * *